(12) United States Patent
Lu et al.

(10) Patent No.: US 10,700,704 B2
(45) Date of Patent: Jun. 30, 2020

(54) SERIAL GENERAL PURPOSE INPUT/OUTPUT SYSTEM

(71) Applicants: Inventec (Pudong) Technology Corp., Shanghai (CN); Inventec Corporation, Taipei (TW)

(72) Inventors: Chun-Chieh Lu, Taipei (TW); Hsiang-Chun Hu, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 53 days.

(21) Appl. No.: 16/219,819

(22) Filed: Dec. 13, 2018

(65) Prior Publication Data

US 2020/0162105 A1 May 21, 2020

(30) Foreign Application Priority Data

Nov. 16, 2018 (CN) .......................... 2018 1 1364542

(51) Int. Cl.
*H03M 13/09* (2006.01)
*H04L 1/00* (2006.01)
*G06F 11/10* (2006.01)

(52) U.S. Cl.
CPC ......... *H03M 13/09* (2013.01); *G06F 11/1004* (2013.01); *H04L 1/0083* (2013.01)

(58) Field of Classification Search
CPC ... H03M 13/09; G06F 11/1004; H04L 1/0083
USPC ................................. 714/758, 776, 800, 821
See application file for complete search history.

(56) References Cited

U.S. PATENT DOCUMENTS

| 9,443,568 B2* | 9/2016 | Lu ........................ G06F 13/1673 |
| 2007/0079032 A1* | 4/2007 | Bissessur ............ G06F 13/4291 710/71 |
| 2009/0089473 A1* | 4/2009 | He ........................ G06F 13/385 710/300 |
| 2015/0026526 A1* | 1/2015 | Mondal ................. G06F 11/221 714/43 |
| 2015/0149684 A1* | 5/2015 | Dhandapani ........ G06F 13/4282 710/313 |
| 2015/0161069 A1* | 6/2015 | Dhandapani ........ G06F 13/4054 710/301 |
| 2016/0148658 A1* | 5/2016 | Lu ........................ G06F 13/1673 365/189.02 |
| 2017/0168964 A1* | 6/2017 | Kung ................... G06F 13/4068 |
| 2018/0246835 A1* | 8/2018 | Lu ........................... G06F 13/42 |

* cited by examiner

*Primary Examiner* — John J Tabone, Jr.
(74) *Attorney, Agent, or Firm* — Winston Hsu

(57) ABSTRACT

A serial general purpose input/output system includes a transmitter, a cable, a receiver and a verification unit. The transmitter includes an encoder to perform cyclic redundancy check coding on a data to generate a cyclic redundancy check code for verifying the accuracy of the data, and a first serial general purpose input/output connector coupled to the encoder to transmit the data and the cyclic redundancy check code. The receiver includes a second serial general purpose input/output connector coupled to the first serial general purpose input/output connector by the serial general purpose input/output cable to receive the data and the cyclic redundancy check code from the first serial general purpose input/output connector.

10 Claims, 3 Drawing Sheets

SERIAL GENERAL PURPOSE INPUT/OUTPUT SYSTEM

BACKGROUND OF THE INVENTION

1. Field of the Invention

The present invention is related to a serial general purpose input/output (SGPIO) system, and particularly to a serial general purpose input/output system with a cyclic redundancy check (CRC) function.

2. Description of the Prior Art

During a system control process, signals are transmitted between components where the output signal of the previous stage usually serves as the input signal of the next stage. However, during transmitting signals, the signals output from the components, such as the signals input by a keyboard or keys, are not ones with ideal and perfect waveforms. According to the physical nature, when a characteristic or an electrical level is instantly changed, it is unable to change the state immediately. Instead, a reaction is produced, and before the signal enters the stable output state, a bounce phenomenon occurs where multiple digits 0 and 1 alternately move up and down in view of digital signal. The phenomenon makes the system treat the signal at the input terminal thereof as a continuous input signal, which leads a state misjudgement and an error message.

In particular for some devices of a system, in terms of the setting of logic judgment, once a state-changing phenomenon is detected out, the system would enter a phase to process the voltage or the error message. Even further, an unstable signal may cause a system shutdown or crash. In this regard, prior to inputting the output signals of the devices to the components of the next stage, a debounce circuit is used to debounce the signals such that the input signals are transferred to the output signals through a debounce delay buffer until the state gets stable; and at the time, the signals are input to the components of the next stage.

The debounce circuit of the prior art usually takes samples of an input signal, and the sampling frequency must be more than ten times higher than the frequency of the input signal. When the input signal is in transition (from logic value 0 to 1 or from logic value 1 to 0) and the sampled input signal contains consecutive is or Os, the system determines that the input signal has reached to a steady state and can output the debounced signal.

Currently, when data transmission is performed on circuits that use an SGPIO bus, there is not an encoding process. Signal noise or interference on the bus caused by component aging or manufacturing errors is usually removed by adding a debounce circuit to the receiver. However, not all components can have a debounce circuit. The sampling frequency required for the debounce circuit of the prior art must be more than ten times higher than the frequency of the input signal. For some electronic devices, it is not possible to provide the signal with such high sampling frequency. Further, even with the addition of debounce circuits, it is still difficult to determine the accuracy of the transmitted data due to aging circuit components.

SUMMARY OF THE INVENTION

An embodiment discloses a serial general purpose input/output (SGPIO) system comprising a transmitter, an SGPIO cable, and a receiver. The transmitter comprises an encoder to perform cyclic redundancy check (CRC) coding on a data to generate a CRC code for verifying the accuracy of the data and a first SGPIO connector coupled to the encoder used to transmit the data and the CRC code. The receiver comprises a second SGPIO connector and a verification unit. The second SGPIO connector is coupled to the first SGPIO connector by the SGPIO cable to receive the data and the CRC code from the first SGPIO connector. The verification unit is coupled to the second SGPIO connector for verifying the data received from the second SGPIO connector by the CRC code.

These and other objectives of the present invention will no doubt become obvious to those of ordinary skill in the art after reading the following detailed description of the preferred embodiment that is illustrated in the various figures and drawings.

DETAILED DESCRIPTION

The invention mainly uses a serial general purpose input/output (SGPIO) bus to perform data transmission and using a cyclic redundancy check (CRC) encoding technique to generate a CRC code, so that the receiver can confirm the accuracy of the received data according to the CRC code.

Figure 1:
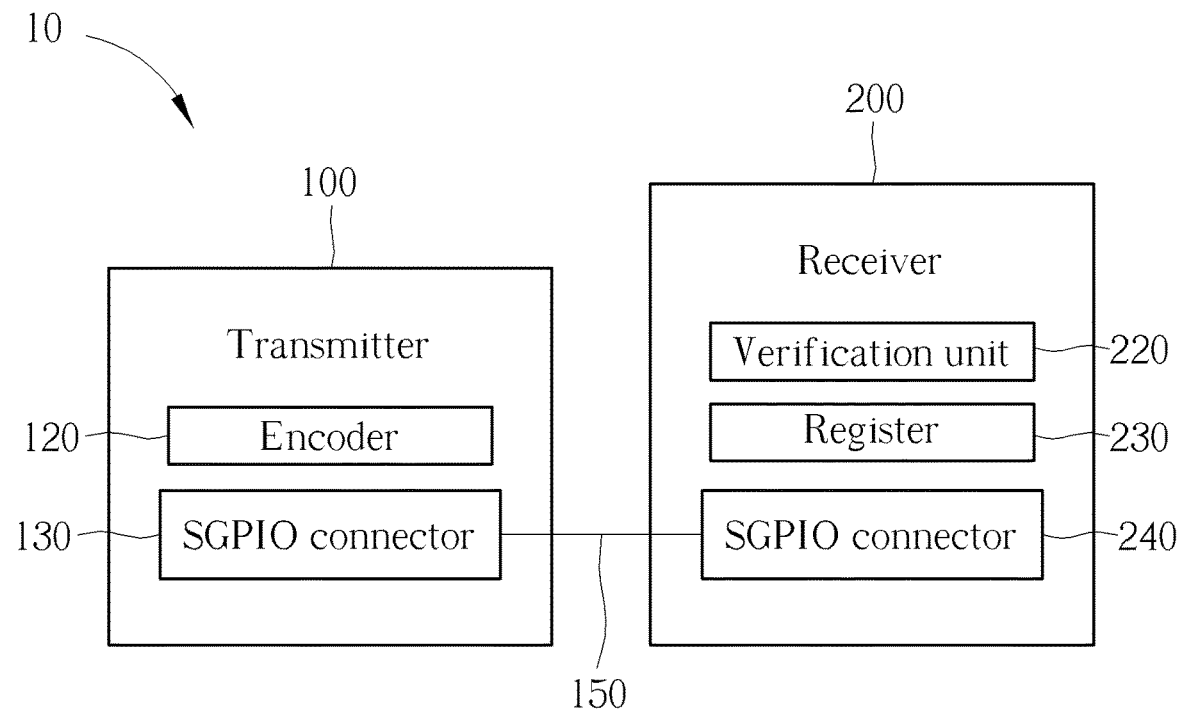
FIG. 1 is a block diagram of a serial general purpose input/output (SGPIO) system of an embodiment of the present invention.
Figure 2:
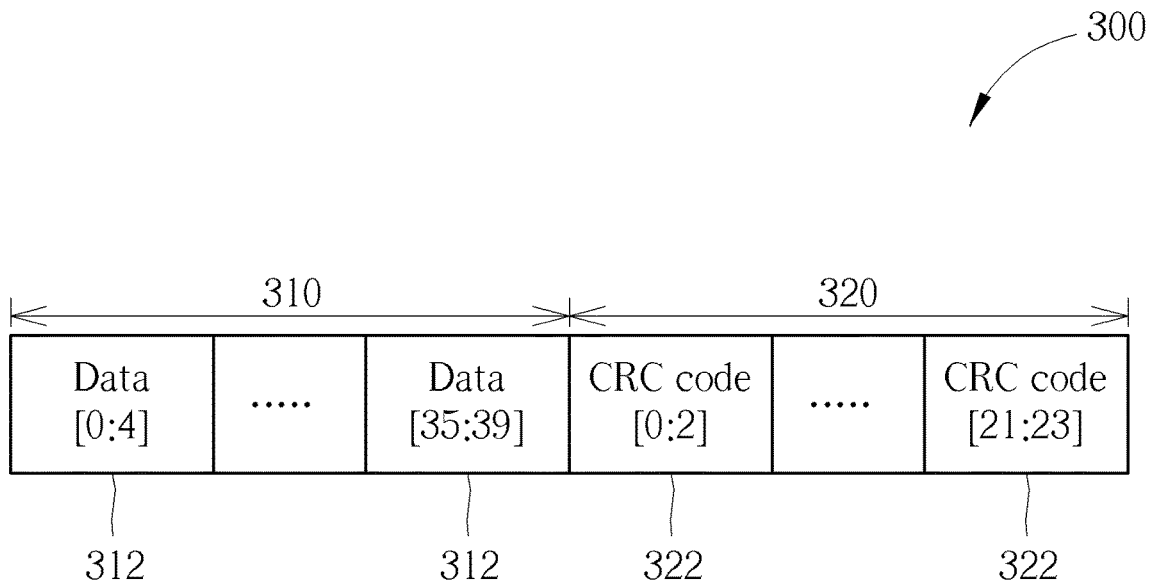
FIG. 2 shows a block diagram of the data structure of the data string generated by the encoder of the SGPIO system of FIG. 1.

FIG. 1 is a block diagram of a serial general purpose input/output (SGPIO) system 10 in an embodiment of the present invention. FIG. 2 is a data structure diagram of a data string 300 generated by the encoder 120 of the SGPIO system 10 of FIG. 1. The SGPIO system 10 includes a transmitter 100, SGPIO cable 150, and a receiver 200. The transmitter 100 transmits the data string 300 to the receiver 200 through the SGPIO cable 150. In the embodiment, the transmitter 100 may be a complex programmable logic device (CPLD), and the receiver 200 may be a baseboard management controller (BMC), but not limited thereto. Furthermore, as shown in FIG. 2, the data string 300 includes data 310 and a CRC code 320. The data 310 is the original data to be transmitted to the receiver 200 by the transmitter 100, and the CRC code 320 is for verifying the accuracy of the data 310. Further, as shown in FIG. 1, the transmitter 100 includes an encoder 120 and an SGPIO connector 130. The encoder 120 is used to perform CRC encoding on the data 310 to generate the CRC code 320. The transmitter 100 is used to transmit the data string 300 including the data 310 and the CRC code 320 to the receiver 200 by the SGPIO connector 130 and the SGPIO cable 150. The receiver 200 includes another SGPIO connector 240 and a verification unit 220. The SGPIO connector 240 is coupled to the SGPIO connector 130 of the transmitter 100 via the SGPIO cable 150 for receiving the data 310 and the CRC code 320 from the SGPIO connector 130. The verification unit 220 is coupled to the SGPIO connector 240 for verifying the data 310 received by the SGPIO connector 240 according to the CRC code 320. In addition, the receiver 200 may further include a register 230 for storing the data string 300 received from the SGPIO connector 240.

Generally, the SGPIO connector 130 of the transmitter 100 has four pins, an SClock, an SLoad, an SDataOut and an SDataIn, as defined in the SGPIO specification. The three pins, the SClock, the SLoad and the SDataOut, send corresponding signals from the transmitter 100 to the receiver 200, and the SDataIn pin receives signals from the transmitter 100. In general, not all SGPIO devices support the SDataIn pin, so the signal line of the SDataIn is optional. Further, the signal to the SClock pin defines the clock used by the SGPIO bus to transmit data. The signal to the SLoad pin defines the starting time and ending time of the frame used when transmitting data. Generally, the signal to the SLoad pin can be an active low signal or an active high signal. When the signal to the SLoad pin is an active low signal, each frame of the SGPIO system 10 is defined by two adjacent low pulses of the signal to the SLoad pin. In this case, the time period of each frame of the SGPIO system 10 is between the two adjacent low pulses in the SLoad signal. In contrast, when the signal to the SLoad pin is an active high signal, each frame of the SGPIO system 10 is defined by two adjacent high pulses of the signal to the SLoad pin. In this case, the time period of each frame of the SGPIO system 10 is between the two adjacent high pulses in the SLoad signal. In addition, the SDataOut pin transmits the serial data string 300 from the transmitter 100 to the receiver 200.

Figure 3:
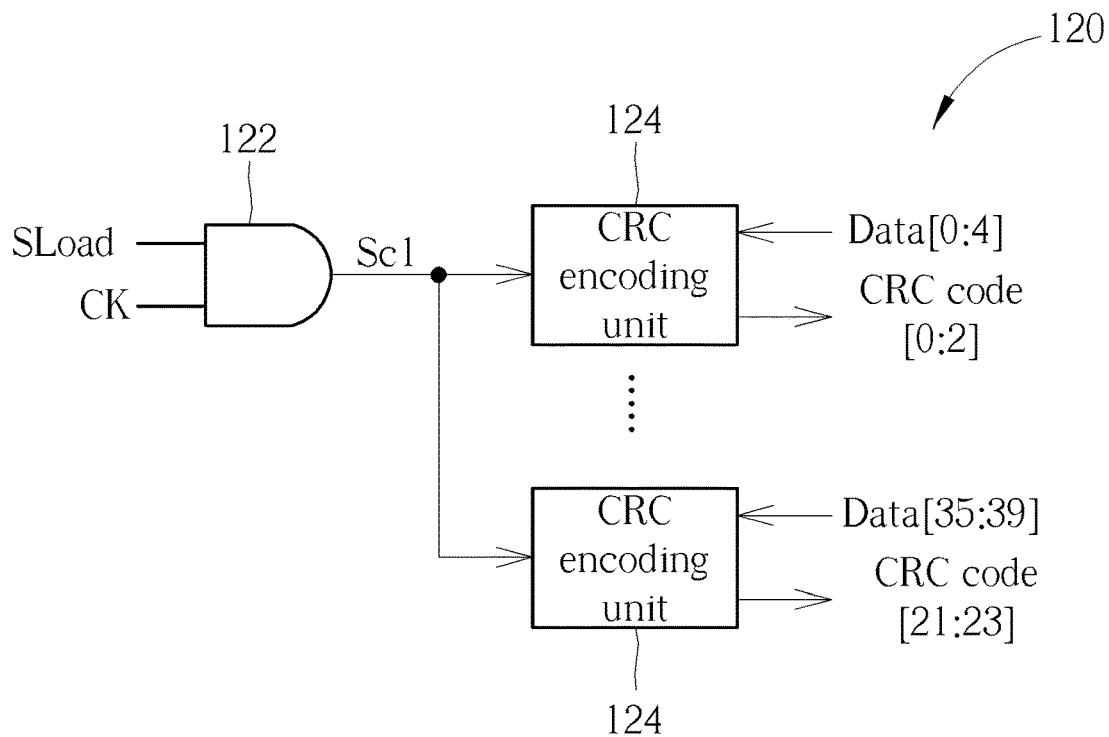
FIG. 3 is a diagram of an embodiment for the encoder of the SGPIO system of FIG. 1.

FIG. 3 is a diagram of an embodiment for the encoder 120 of the SGPIO system 10. In this embodiment, the signal to the SLoad pin of the SGPIO connector 130 of the transmitter 100 is an active low signal. The encoder 120 includes a plurality of CRC encoding units 124, and each CRC encoding unit 124 encodes a plurality of bits corresponding to the data 310 in each frame of the SGPIO system 10 to generate corresponding bits of the CRC code 320. In detail, in the embodiment, the encoder 120 includes a total of eight CRC encoding units 124. Each CRC encoding unit 124 is a CRC-3 encoding unit for encoding five bits in the data 310 in each frame of the SGPIO system 10 to generate three corresponding bits of the CRC code 320. For example, the first CRC encoding unit 124 encodes the first five bits [0:4] of the data 310 to generate the first three bits [0:2] of the CRC code 320. The last CRC encoding unit 124 encodes the last five bits [35:39] of the data 310 to generate the last three bits [21:23] of the CRC code 320. The number of CRC encoding units 124 included in the encoder 120 is not limited to eight. For example, the encoder 120 may include only a single CRC encoding unit 124 for encoding the data 310 to generate the CRC code 320. The number of CRC encoding units 124 included in the encoder 120 can be adjusted according to application requirements. In addition, each above-mentioned CRC encoding unit 124 may be a CRC encoding unit of other output lengths. For example, each CRC coding unit 124 may be a CRC-5 encoding unit for outputting CRC codes with a length of 5 bits.

The data string 300 in FIG. 2 represents the data 310 and its corresponding CRC code 320 in one of the frames of the SGPIO system 10. According to the standard of the SGPIO specification, the data in each frame transmitted by the SGPIO system 10 can be 64 bits, so the length of the data string 300 in each frame transmitted by the transmitter 100 can be 64 bits. The data 310 in the data string 300 can be divided into a plurality of data segments 312, and each data segment 312 is a plurality of bits transmitted to the corresponding CRC encoding unit 124. For example, the first data segment 312 contains the first five bits [0:4] of the data 310, and the first five bits [0:4] are transmitted to the first CRC encoding unit 124 of the encoder 120. In addition, the CRC code 320 in the data string 300 can be divided into a plurality of CRC segments 322, and each CRC segment 322 is a plurality of bits outputted by one of the CRC encoding unit 124. For example, the last CRC segment 322 contains the last three bits [21:23] of the CRC code 320, and the three bits [21:23] are generated by the last CRC encoding unit 124 of the encoder 120.

In addition, the total number of bits of the CRC code 320 can be determined according to the number of idle time slots of the SGPIO system 10, wherein an idle time slot is a time slot that the SGPIO system 10 does not use to transmit the data 310. In particular, if each frame of the SGPIO system 10 has eight time slots and each time slot can carry eight bits, the data length of the data 310 would be 40 bits. Since the 40 bits of the data 310 can be transmitted in five time slots (5 time slots×8 bits/time slot=40 bits), in this case the SGPIO system 10 has three idle time slots (8 time slots-5 time slots=3 time slots). The total number of bits in the CRC code 320 would be 24 bits (3 time slots×8 bits/time slot=24 bits).

In the embodiment of FIG. 3, the plurality of CRC encoding units 124 in the encoder 120 perform CRC encoding on the corresponding plurality of bits of the data 310 in parallel to generate the CRC code 320 so as to improve the efficiency of CRC encoding. In addition, since the signal to the SLoad pin of the SGPIO connector 130 is an active low signal, the encoder 120 may further include an AND gate 122 used to perform an AND operation on encoding clock CK and the signal to the SLoad pin of the SGPIO connector 130 to generate an operation clock signal Sc1 for controlling each CRC encoding unit 124. Each of the CRC encoding units 124 performs CRC encoding when the operation clock signal Sc1 is at a low voltage level. In addition, the frequency of the encoding clock CK has the following relationship with the frequency of the SClock pin signal:

$$N < \frac{Fck}{Fsclock} \quad (1)$$

N is the bit length when each CRC encoding unit 124 performs CRC encoding on the data 310. Fck is the frequency of the encoding clock CK, and Fsclock is the frequency of the SClock pin signal. For example, if each CRC encoding unit 124 encodes five bits of data 310, then N is equal to five and Fck must be greater than five times the Fsclock. For another example, if each CRC encoding unit 124 encodes seven bits of data 310, then N is equal to seven and Fck must be greater than seven times the Fsclock.

Figure 4:
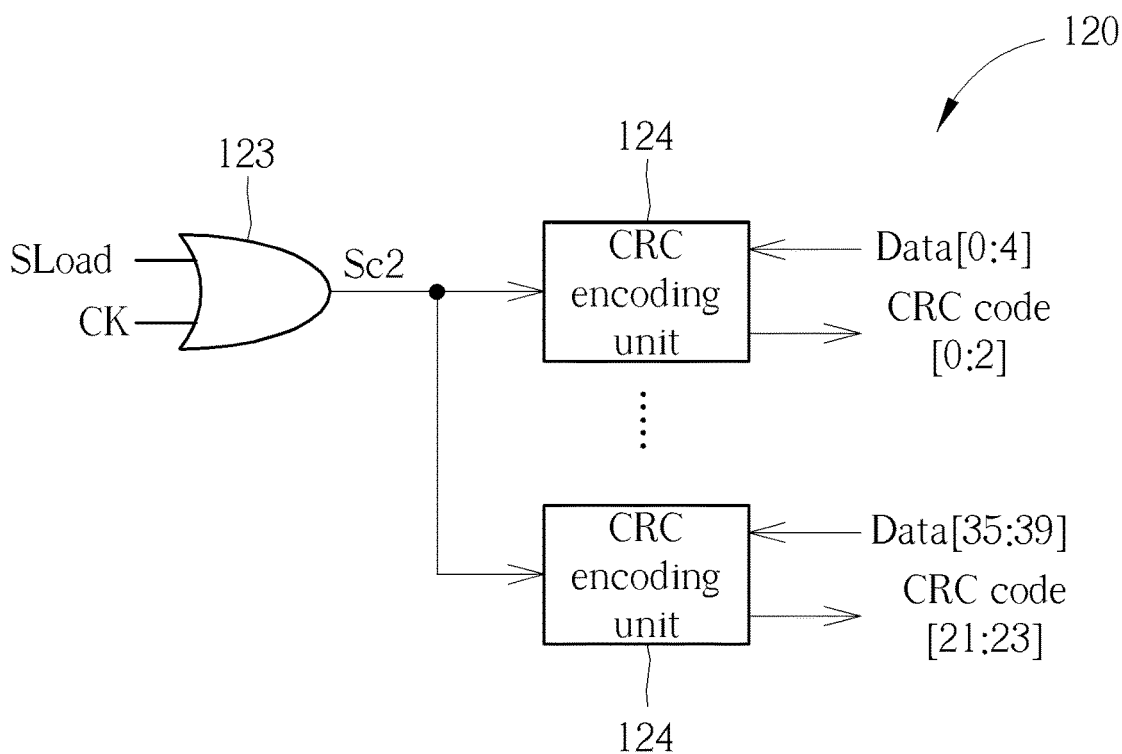
FIG. 4 is a diagram of another embodiment for the encoder of the SGPIO system of FIG. 1.

The signal to the SLoad pin in another embodiment of the present invention may be an active high signal. FIG. 4 is a diagram of another embodiment for the encoder 120. In this embodiment, the signal to the SLoad pin of the SGPIO connector 130 of the transmitter 100 is an active high signal. The encoder 120 also includes a plurality of CRC encoding units 124, and each CRC encoding unit 124 encodes a plurality of bits corresponding to the data 310 in each frame of the SGPIO system 10 to generate corresponding bits of the CRC code 320. The encoder 120 may further include an OR gate 123 used to perform an OR operation on encoding clock CK and the signal to the SLoad pin of the SGPIO connector 130 to generate an operation clock signal Sc2 for controlling each CRC encoding unit 124. Each of the CRC encoding units 124 performs CRC encoding when the operation clock signal Sc2 is at a high voltage level. In addition, relationship of the frequency Fck and the frequency Fsclock is described by the above equation (1). The description will not be repeated here.

Figure 5:
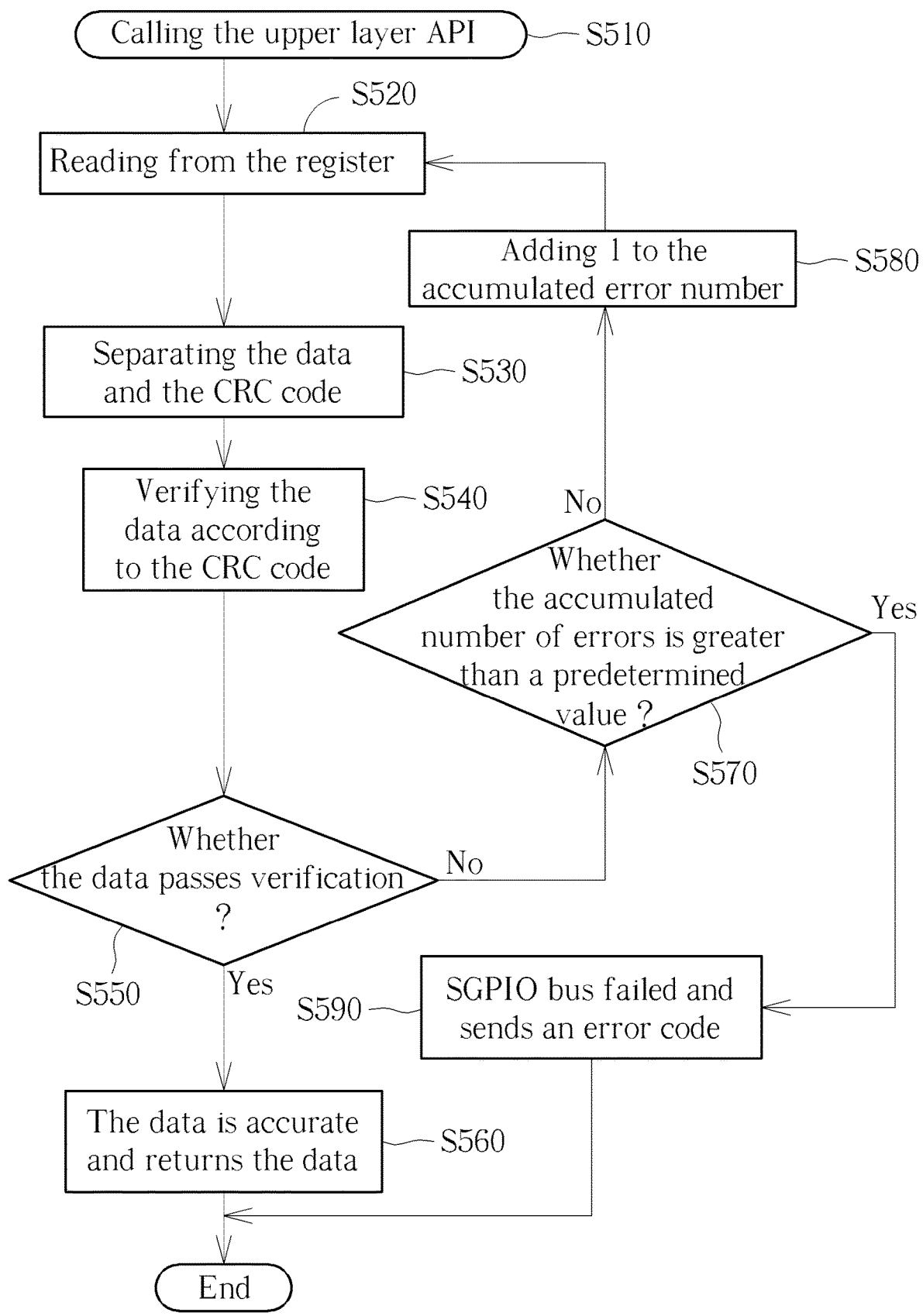
FIG. 5 is an operation sequence diagram for the verification unit of the SGPIO system of an embodiment.

FIG. 5 is the operation sequence diagram for the verification unit 220 of the SGPIO system 10 of the embodiment of the present invention. When the verification unit 220 receives the data string 300 and verifies the accuracy of the data 310 therein, the following steps are performed:

Step S510: calling an application programming interface (API) of an upper layer, and causing the verification unit 220 to start the CRC verification process;

Step S520: the verification unit 220 reads the data string 300 from the register 230;

Step S530: the verification unit 220 separates the data 310 and the CRC code 320 from the data string 300;

Step S540: the verification unit 220 verifies the accuracy of the data 310 according to the CRC code 320;

Step S550: the verification unit 220 determines whether the data 310 passes the CRC verification in step S540; if so, go to step S560; else go to step S570;

Step S560: the verification unit 220 confirms that the data 310 is accurate and returns the confirmed data 310 to other components of the receiver 200 for subsequent process;

Step S570: The verification unit 220 determines whether the accumulated number of errors (the accumulated number of times the CRC verification fails) is greater than a predetermined value (i.e., 5 times); if so, go to step S590; else go to step S580;

Step S580: the verification unit 220 adds 1 to the accumulated error number, and go to step S520;

Step S590: the verification unit 220 determines that the SGPIO bus has an error and generates a corresponding error code to notify the user that the current SGPIO bus has failed.

The above-mentioned accumulated number of errors may be reset to 0 at step S560.

The system using the SGPIO bus of the prior art does not have a CRC verification mechanism. The SGPIO system of the present invention has a transmitter including an encoder that can perform CRC encoding on the data, so that the receiver can verify the accuracy of the data according to the CRC code generated by the encoder. Therefore, the receiver of the SGPIO system of the present invention can determine whether the data is accurate and can send an error code to immediately notify the user when the data is incorrect without the need of a debounce circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A serial general purpose input/output system comprising:
a transmitter comprising:
an encoder configured to perform cyclic redundancy check encoding on data to generate a cyclic redundancy check code for verifying the accuracy of the data; and
a first serial general purpose input/output connector coupled to the encoder and configured to transmit the data and the cyclic redundancy check code;
a serial general purpose input/output cable connected to the first serial general purpose input/output connector; and
a receiver comprising:
a second serial general purpose input/output connector coupled to the first serial general purpose input/output connector by the serial general purpose input/output cable and configured to receive the data and the cyclic redundancy check code from the first serial general purpose input/output connector; and
a verification unit coupled to the second serial general purpose input/output connector and configured to verify the data received by the second serial general purpose input/output connector according to the cyclic redundancy check code.

2. The serial general purpose input/output system of claim 1, wherein the encoder comprises a plurality of cyclic redundancy check encoding units, and each cyclic redundancy check encoding unit is configured to encode a plurality of bits corresponding to the data in each frame of the serial general purpose input/output system to generate corresponding bits of the cyclic redundancy check code in each frame.

3. The serial general purpose input/output system of claim 2, wherein the cyclic redundancy check encoding units perform cyclic redundancy check encoding in parallel on the data to generate the cyclic redundancy check code.

4. The serial general purpose input/output system of claim 2, wherein a signal to a first pin of the first serial general purpose input/output connector is an active low signal, and the encoder further comprises an AND gate configured to perform an AND operation on an encoding clock and the signal to the first pin of the first serial general purpose input/output connector to generate an operation clock signal to control each cyclic redundancy check encoding unit.

5. The serial general purpose input/output system of claim 4, wherein each cyclic redundancy check encoding unit encodes N bits of the data in each frame of the serial general purpose input/output system according to the operation clock signal, N being an integer greater than one, and a frequency of the encoding clock is greater than N times a frequency of a signal to a clock pin of the first serial general purpose input/output connector.

6. The serial general purpose input/output system of claim 2, wherein a signal to a first pin of the first serial general purpose input/output connector is an active high signal, and the encoder further comprises an OR gate configured to perform an OR operation on an encoding clock and on the signal to the first pin of the first serial general purpose input/output connector to generate an operation clock signal to control each cyclic redundancy check encoding unit.

7. The serial general purpose input/output system of claim 6, wherein each cyclic redundancy check encoding unit encodes N bits of the data in each frame of the serial general purpose input/output system according to the operation clock signal, N being an integer greater than one, and a frequency of the encoding clock is greater than N times a frequency of a signal to a clock pin of the first serial general purpose input/output connector.

8. The serial general purpose input/output system of claim 1, wherein the cyclic redundancy check encoder comprises a cyclic redundancy check encoding unit configured to perform cyclic redundancy check encoding on the plurality of bits of the data in each frame of the serial general purpose input/output system to generate the cyclic redundancy check code.

9. The serial general purpose input/output system of claim 1, wherein a number of total bits of the cyclic redundancy check code is determined by a number of idle time slots of the serial general purpose input/output system.

10. The serial general purpose input/output system of claim 1, wherein the transmitter is a complex programmable logic device, and the receiver is a baseboard management controller.

\* \* \* \* \*